United States Patent
Richiuso et al.

(10) Patent No.: US 7,808,752 B2
(45) Date of Patent: Oct. 5, 2010

(54) INTEGRATED PASSIVE FILTER INCORPORATING INDUCTORS AND ESD PROTECTORS

(75) Inventors: Dominick Richiuso, Saratoga, CA (US); William N. Buchele, Los Gatos, CA (US); Anguel Brankov, San Jose, CA (US); Rong Liu, Fremont, CA (US); John M. Jorgensen, Los Gatos, CA (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 292 days.

(21) Appl. No.: 11/206,667

(22) Filed: Aug. 17, 2005

(65) Prior Publication Data

US 2006/0038635 A1    Feb. 23, 2006

Related U.S. Application Data

(60) Provisional application No. 60/602,412, filed on Aug. 17, 2004.

(51) Int. Cl.
  *H02H 9/00* (2006.01)
(52) U.S. Cl. .................... 361/56; 361/91.1; 361/111; 361/119
(58) Field of Classification Search ................ 361/119, 361/56, 91.1, 111
See application file for complete search history.

(56) References Cited

U.S. PATENT DOCUMENTS

| | | | | |
|---|---|---|---|---|
| 2,153,857 | A | * | 4/1939 | Wheeler ................ 330/57 |
| 3,042,885 | A | * | 7/1962 | Myers ................ 333/175 |
| 4,147,997 | A | | 4/1979 | Greaves |
| 6,121,825 | A | | 9/2000 | Ko et al. |
| 6,538,532 | B2 | * | 3/2003 | Petrovic ................ 333/177 |
| 6,970,057 | B2 | * | 11/2005 | Lin et al. ................ 333/177 |
| 7,151,036 | B1 | * | 12/2006 | Goldberger et al. .......... 438/329 |
| 7,262,681 | B2 | * | 8/2007 | Hurley ................ 336/200 |
| 2005/0104158 | A1 | * | 5/2005 | Bhattacharjee et al. ...... 257/531 |

OTHER PUBLICATIONS

Lepkowski, Jim. "Zener Diode Based Integrated Passive Device Filters, An Alternative to Traditional I/O EMI Filter Devices". Jun. 2001.*

* cited by examiner

*Primary Examiner*—Jared J Fureman
*Assistant Examiner*—Christopher J Clark
(74) *Attorney, Agent, or Firm*—Pillsbury Winthrop Shaw Pittman LLP

(57) ABSTRACT

A method for implementing an inductor-capacitor filter in an integrated circuit. Embodiments of the invention implement a 5-pole LC low-pass filter suitable for incorporation in wireless applications necessitating compact layouts. Inductors are formed in an IC as concentric coils on metallization layers, the concentric coils providing a negative coupling coefficient between the inductors. The invention provides programmable frequency response characteristics, enabling the transmission of high-frequency base band information while attenuating carrier RF frequencies.

23 Claims, 8 Drawing Sheets

INTEGRATED PASSIVE FILTER INCORPORATING INDUCTORS AND ESD PROTECTORS

CROSS REFERENCE TO RELATED APPLICATIONS

This application claims the benefit of priority to U.S. Provisional Application No. 60/602,412, filed on Aug. 17, 2004, which is fully incorporated herein by reference and for all purposes.

BACKGROUND OF THE INVENTION

1. Field of the Invention

The present invention relates to inductors and methods for providing inductors in an Integrated Circuit. More particularly, the present invention relates to inductors that permit the implementation of high performance filters and ESD protection in an Integrated Circuit.

2. Description of Related Art

Modern electronic systems, especially mobile wireless applications, require the implementation of circuits having filtering and electrostatic discharge protection attributes. In addition, the systems must consume very little space and therefore demand solutions with extremely small footprints. Since these systems are prevalent in many consumer applications such as cellular handsets it is important that component cost be minimized. In wireless applications such as cellular handsets, filters are required to separate base band information frequencies from radio frequencies ("RF") carrier signals.

Referring to FIG. 1, a low pass filter is often used to separate base band and RF frequencies. The low pass filter has a certain insertion loss and provides a pass band 180 that has a direct current ("DC") starting frequency 100 and terminates at the filter cutoff frequency 102. The cutoff frequency 102 is defined as that frequency at which the attenuation is 3 dB greater than the attenuation at DC.

As frequency increases beyond the cutoff frequency 102, the filter exhibits a roll off 12 with increasing attenuation at higher frequencies until a resonant point 14 is reached at which time the response usually reaches maximum attenuation. Beyond this point, the response generally exhibits a return upward (decreasing attenuation) 16.

Now referring also to FIG. 2, in a typical cellular telephone application, it is desirable to have a filter pass band 18 capable of permitting signals containing desired information to pass from one circuit or system block to another while severely attenuating the high frequencies associated with a carrier signal. These RF frequencies are typically in the range from 800 MHz to 2.7 GHz. Low pass filter components can keep RF energy generated outside the phone from entering the phone, prevent RF energy generated within the handset from radiating to the outside environment and limit adverse interactions of the RF and base band sections within the phone. As shown in FIG. 2, an example of potential undesired energy exchange may occur in flexible wiring 20 connecting the base 22 of a flip phone to the top 24 of a flip phone.

Current integrated resistor capacitor ("RC") implementations of low pass filters have been fabricated and can provide reasonable performance in meeting current requirements. However, as system data rate demands continue to increase, for example in the processing of larger quantities of multimedia information for higher resolution displays, the desire to have low pass filters with higher cutoff frequencies necessarily follows. Current RC filters generally achieve higher cutoff frequencies by increasing the resistance and decreasing the capacitance. Increasing the resistance has the negative impact of increasing the insertion loss in the pass band so the usual method is that of lowering the capacitance. However, the most severe limitation of these implementations is the limited frequency response roll off rate. While the cutoff frequency can be adjusted upwards to accommodate the higher data rates, the rejection band remains fixed and consequently, a relatively slow roll off rate results and the filter attenuation at radio frequencies is compromised.

SUMMARY OF THE INVENTION

The current invention addresses the constraints of RC low pass filters by providing a method for implementing inductor-capacitor ("LC") low pass filters. Embodiments of the invention provide filters including capacitors, inductors and zener diodes to implement a low pass filter with desired frequency response characteristics. The frequency response characteristics may be implemented by varying the quantity and values of the capacitors and inductors included in any embodiment.

Electrostatic discharge ("ESD") protection may be provided in some embodiments by using zener diodes to implement the capacitor function. Embodiments of the invention create inductors by etching or otherwise creating coils in metal layers in an integrated circuit. Further, inductors can be located proximately to modify filter characteristics through mutual coupling of magnetic fields.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION OF A PREFERRED EMBODIMENT OF THE INVENTION

Embodiments of the present invention will now be described in detail with reference to the drawings, which are provided as illustrative examples so as to enable those skilled in the art to practice the invention. Notably, the figures and examples below are not meant to limit the scope of the present invention. Where certain elements of these embodiments can be partially or fully implemented using known components, only those portions of such known components that are necessary for an understanding of the present invention will be described, and detailed descriptions of other portions of such known components will be omitted so as not to obscure the invention. Further, the present invention encompasses present and future known equivalents to the components referred to herein by way of illustration.

Figure 1:
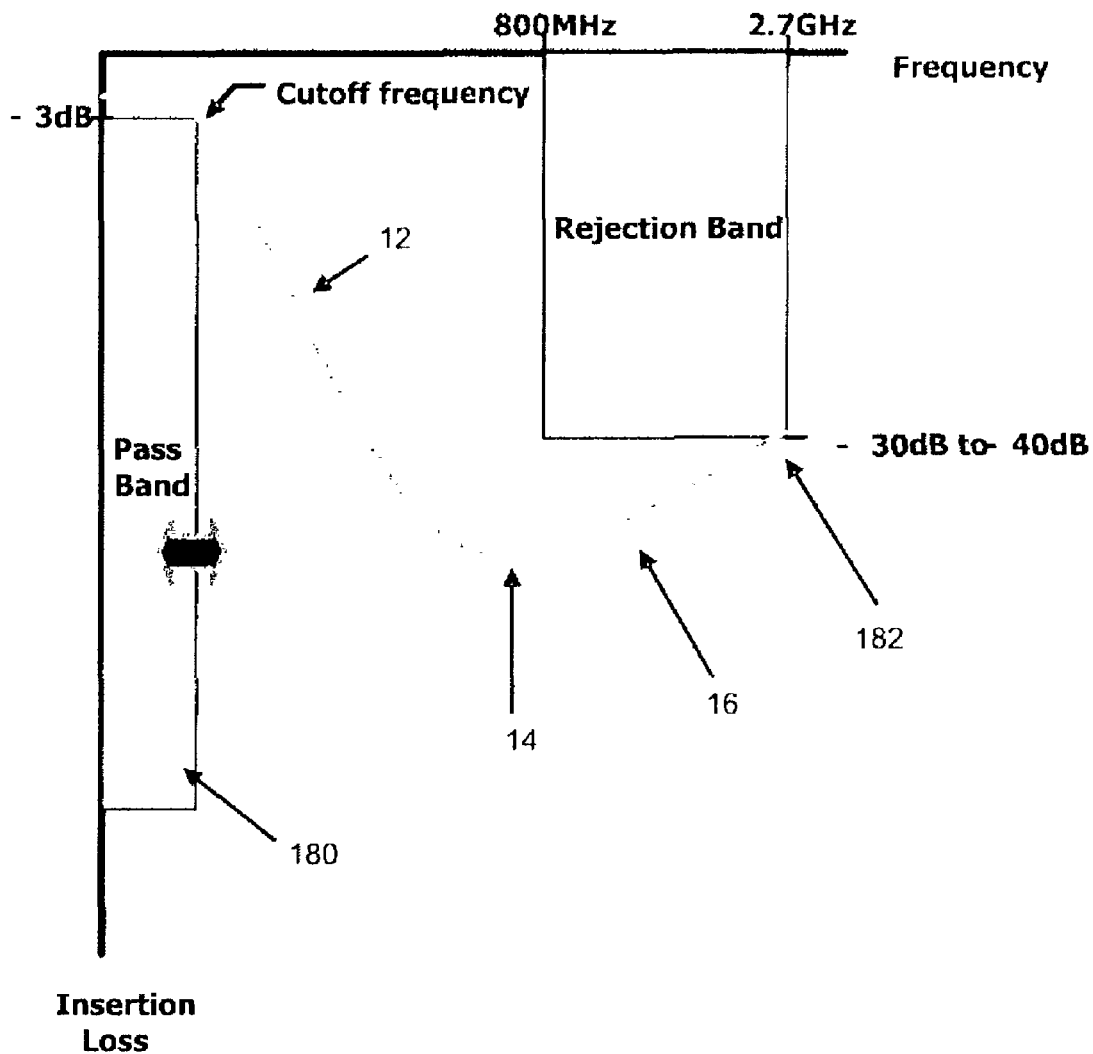
FIG. 1 is a frequency response chart of a prior art resistor-capacitor ("RC") low-pass filter.
Figure 2:
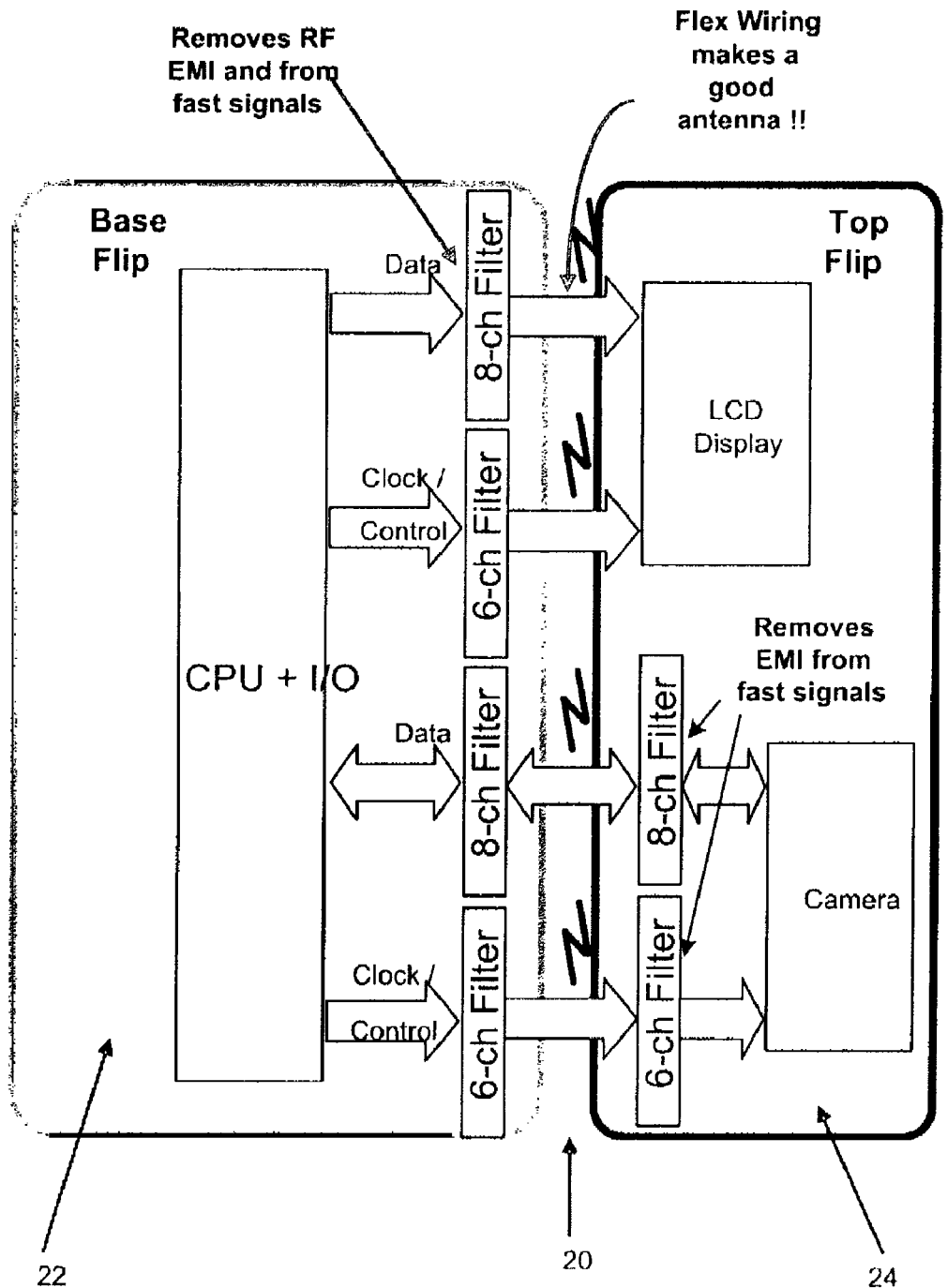
FIG. 2 is a functional representation of an application for low-pass filters.
Figure 3:
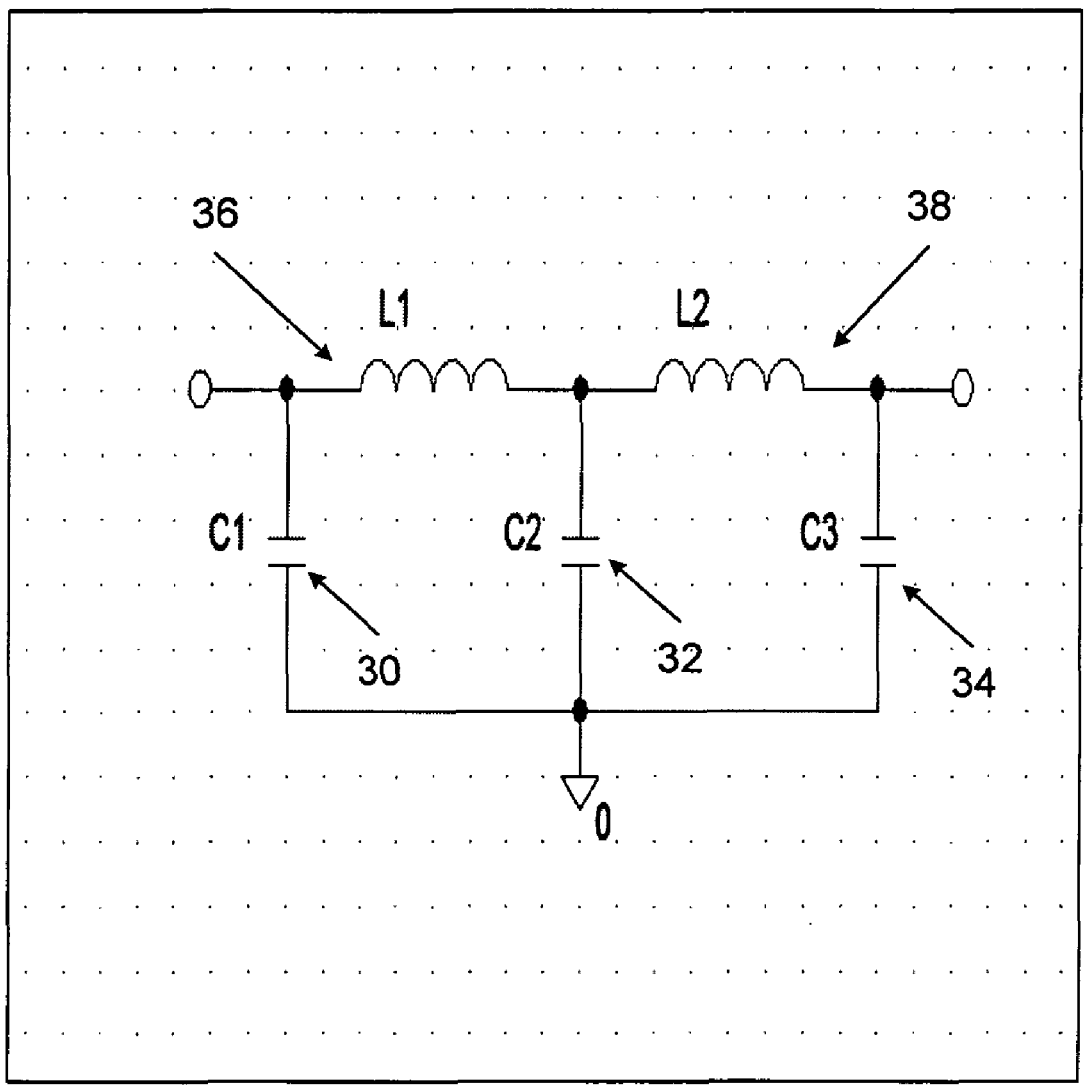
FIG. 3 is a schematic representation of an inductor-capacitor low-pass filter.
Figure 4:
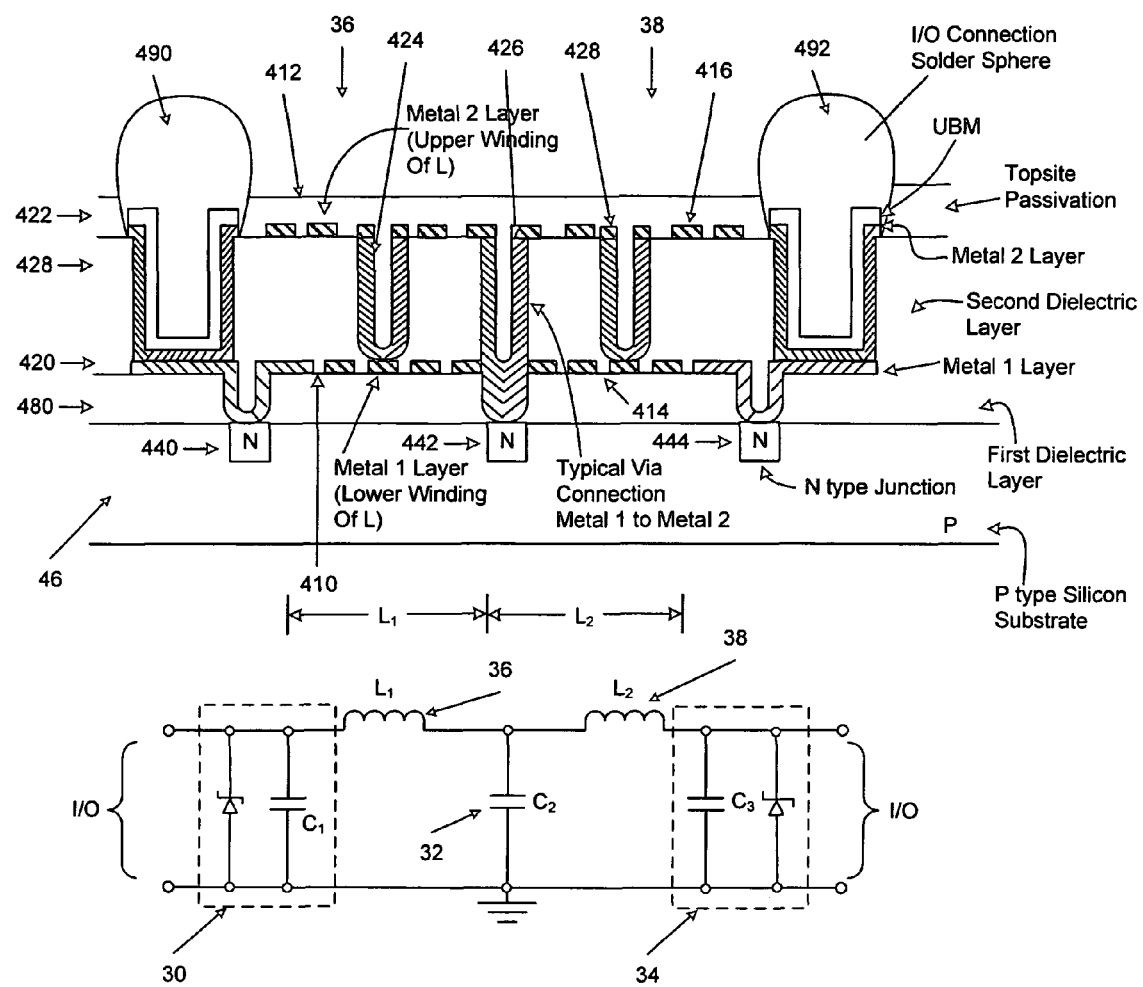
FIG. 4 is a cross-sectional drawing of an exemplary implementation of an LC low-pass filter on an integrated circuit.

Referring to FIGS. 3 and 4, aspects of the invention are illustrated in an example of an embodiment that provides a low pass filter incorporating inductors. FIG. 3 shows a schematic representation of the low pass filter and FIG. 4 provides a cross-sectional view of the structure of such an embodiment implemented on a silicon wafer integrated circuit ("IC"). The illustrated filter will be appreciated by one skilled in the art as a five pole filter that includes three capacitors 30, 32 and 34 and two inductors 36 and 38. It will be further appreciated that other filter combinations may be implemented as desired.

The elements of the filter shown in FIG. 3 are included in the embodiment of FIG. 4. Each inductor 36 and 38 consists of a pair of coils 410/412 and 414/416 implemented on two metallization layers 420 and 422. Zener diodes 440, 442 and 444 are fabricated to provide electrostatic discharge (ESD) protection characteristics to external circuits to which they are connected. In addition to providing ESD protection, these diodes 440, 442 and 444 also serve as the capacitors 30, 32, 34 in the filter circuit. It will be appreciated that the capacitors 30, 32 and 34 may be formed by other means, without affecting the substance of the disclosed invention. The diode structure may be formed with an N-type junction (440, 442 and 444) by ion implantation and diffusion into a low resistivity substrate 46 such as a 0.01-0.02 ohm-cm, P-type substrate. Next a first thick dielectric layer 480 may be formed over the junction using, for example, 2 microns of silicon dioxide.

In many embodiments, inductors are formed by creating coils of conductors in metal layers 420 and 422. The metal layers 420 and 422 may also be used to interconnect elements of the low pass filter. A first metal layer 420 including the first layer of each inductor coil 410, 414 may be formed by, for example, sputtering a 2 micron first metal layer of AlSiCu. Next, a thick second dielectric layer 482 may be deposited above the first metal layer 420 using for example, 5 microns of benzocyclobutane (BCB). A thick second metal layer 422 (for example, 5 microns of Cu) may be plated above the second dielectric layer 482. This second metal layer 422 serves as the second layer winding of each inductor coil 412 and 416. The first and second metal layer coil windings 410 and 412 and 414 and 416 may be connected together by connection vias 424, 426 and 428 through the second dielectric layer 482 separating the first layer coil winding 410 and 414 from the second layer coil winding 412 and 416 of each inductor.

Figure 5:
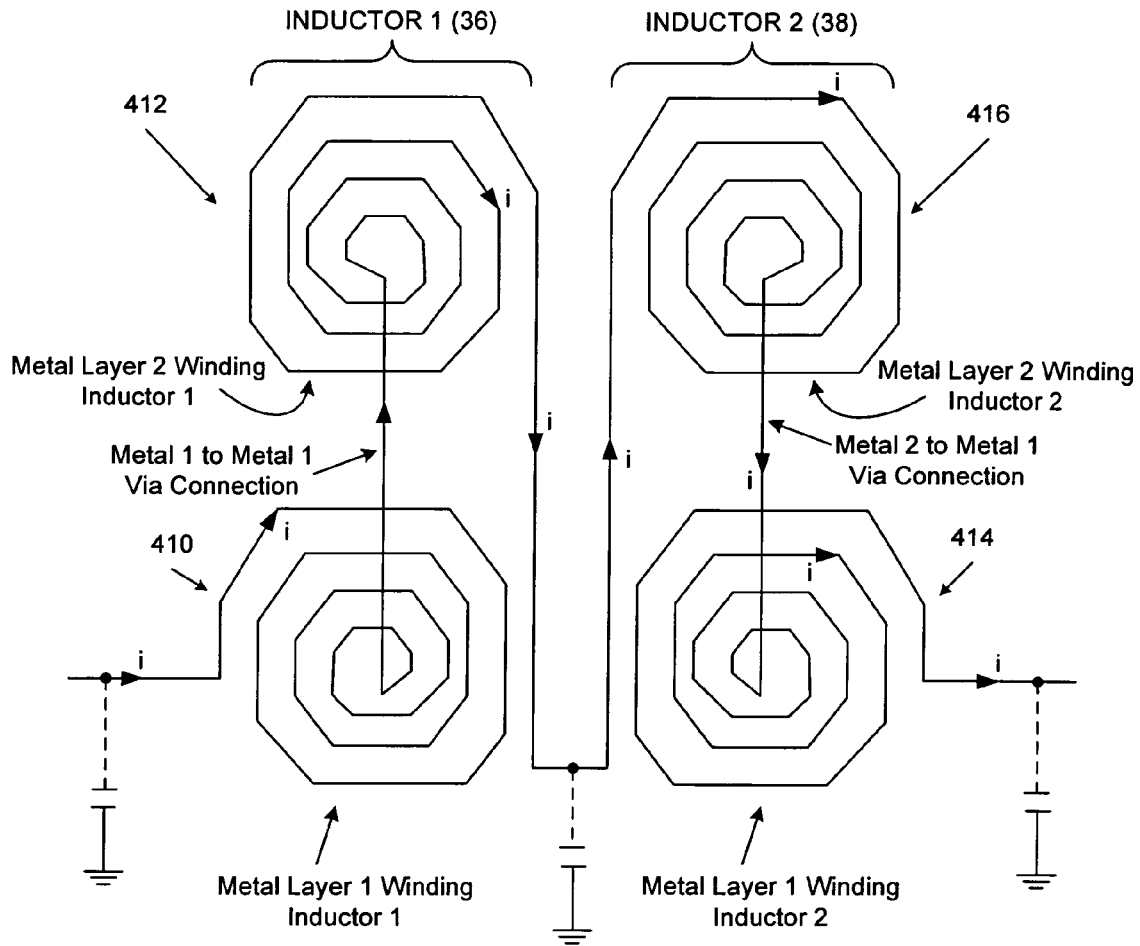
FIG. 5 is a graphical representation of inductor coils of the exemplary embodiment.

Referring now also to FIG. 5, an illustrative representation of the exemplary inductor winding structure is provided. It will be appreciated that the coil windings may be formed in a variety of shapes as required to facilitate fabrication, reduce loss, minimize undesirable parasitic effects and for other reasons affecting performance of the filter. Thus, the coils may be curved or segmented, as preferred. In many embodiments, each coil in an inductor coil pair 410/412 and 414/416 is wound in the same direction as the other coil in the coil pair 412/410 and 416/414 such that, for each coil pair 410/412 and 414/416, the magnetic field generated the coils are directionally aligned (aiding or additive), thereby increasing the coupling and the inductance each inductor 36 and 38. A second layer of the coil 412 and 416 acts as a continuation of the first layer 410 and 414.

In the example illustrated by FIGS. 4 and 5, the first layer winding of the first inductor 410 begins at a first zener diode and capacitor structure 440 and enters a first layer winding of the first inductor 410 on the first metal layer 420. The circuit, winds inward to the center of the first inductor coil 410, connects upward to the second layer winding of the first inductor 412 through a first via 424 in the second dielectric 482 to the second metal layer 422. The circuit then winds outward on the second metal layer 422 and connects to a second via 426, thereby completing the path of the first inductor 36.

Next, the circuit connects downward, through a second via 426 in the second dielectric layer 482 and the first dielectric layer 480, connecting to the zener diode and capacitor structure 442. This latter connection may form the junction 37 of the two inductors 36 and 38 and the center capacitor 32 as shown in the example of FIG. 3. From second via 426, the circuit also continues on the second metal layer 422 to form the top coil winding of the second inductor 416. The latter winding 416 starts from the outermost winding and winds inward toward the center of the top coil winding second inductor 416, winding in the same direction in which the first inductor was wound. At the center of the coil 416 the top winding connects downward through a via 426 in the second dielectric layer 482 to the first metal layer winding of the second inductor 414. On the first metal layer the lower coil winding of the second inductor 414 winds outward from the coil center to the outermost turn of the coil and exits the second inductor 38 to the first metal layer 420, connecting with the third zener diode and capacitor structure 444.

In summary and as provided in the examples illustrated in FIGS. 3, 4 and 5, each inductor 36 and 38 consists of two windings, each winding residing on a separate metal layer, overlaying the other winding and separated by a thick second dielectric. Each coil segment of each inductor may be wound in the same direction and the path followed by an electric current through each winding of each inductor on all layers may follow the same direction (for example, all clockwise or all counterclockwise). The first inductor structure is typically connected in series to the second inductor structure and a center capacitor 32 may be provided at the junction 37 of the first and second-inductor structures. Additionally, the entry node 411 of the first inductor and the exit node 415 of the second inductor may each connect to a zener diode to provide ESD protection. These zener diodes additionally serve as filter capacitors 30 and 34.

It will be appreciated by one skilled in the art that the values of the capacitors 30, 32 and 34 may be selected by altering the structure and layout of the zener diodes 440, 442 and 444 for a given set of diode process parameters. The structure and layout alterations typically modify area and periphery of the zener diodes.

The inductance values of the inductors 36 and 38 may also be selected according to desired characteristics of the filter. Additionally, the inductance values may be determined by, for example, modifying the layout and process parameters for each or all of the fabrication layers. The inductance provided by a given area of the IC may be increased by fabricating an inductor as a two level coil structure, each layer having a winding oriented in the same direction. The use of two coils maximizes the inductance for a given resistance and increases the effective performance of the filter. Additionally, the use of two coils advantageously provides an internal node that permits the addition of the center capacitor 37 to the filter. It will be appreciated that the addition of the center capacitor 32 adds a pole to the filter circuit.

In some embodiments, a thick metal layer can be used and inductor resistance is reduced accordingly. Further, a thick dielectric layers minimizes parasitic capacitance and mitigates eddy current effects attributable to the low resistivity substrate 46. The silicon substrate 46 allows for integrated fabrication of formation of protection diodes (Zener diodes) as well as other semiconductor components (not shown).

Figure 6:
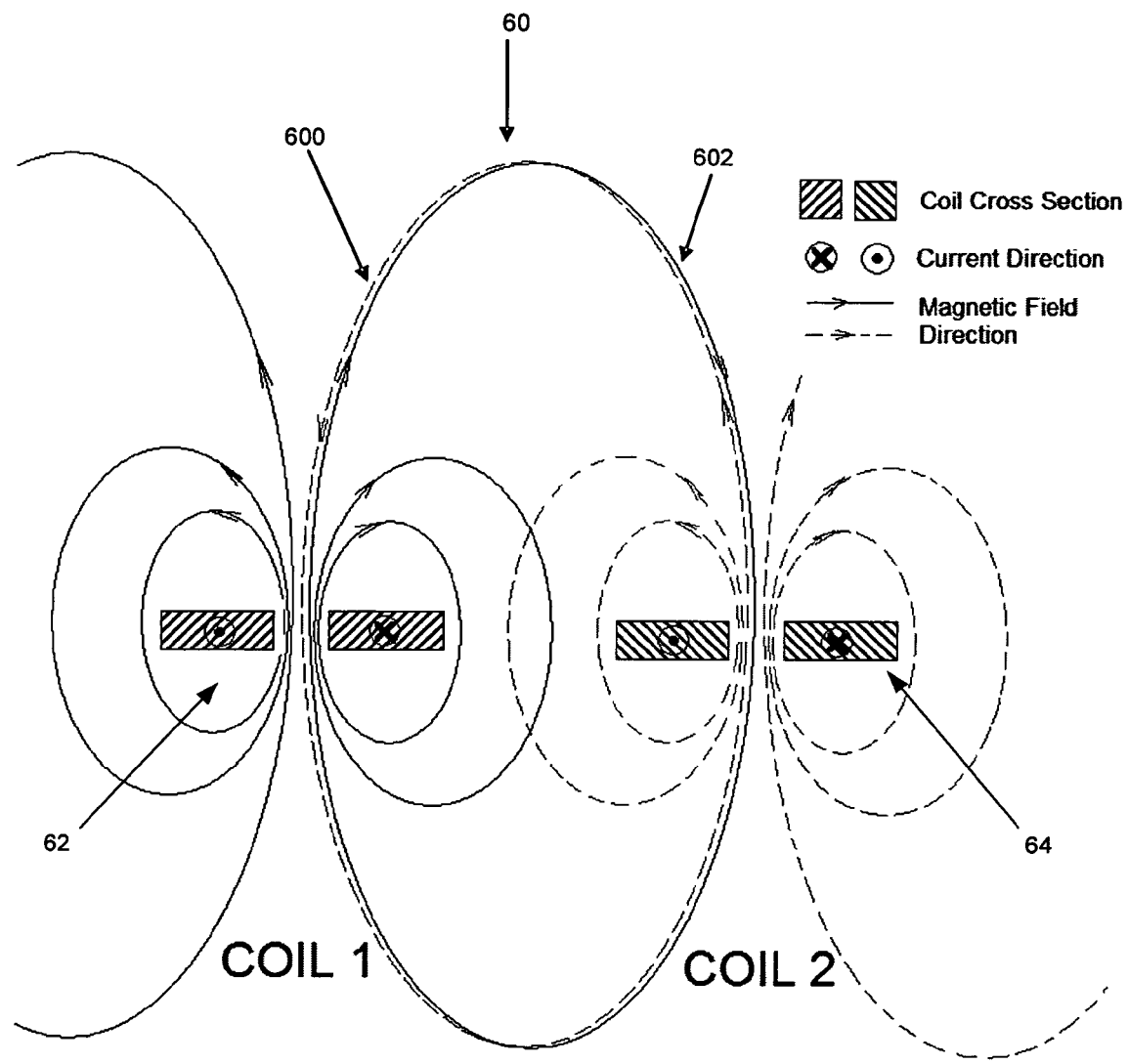
FIG. 6 is an illustration of negative coupling between adjacent inductor cells in the exemplary embodiment.

Referring now to FIG. 6, an illustration is provided of the interaction of magnetic fields 60 generated by two inductor coils 62 and 64 and the concept of negative coupling coefficient will be explained. The two inductor coils 62 and 64 are proximately located and each of the two inductors 62 and 64 is mutually coupled to the other inductor 64 and 62. The mutual coupling results from the magnetic field 60 of each inductor coil 62 and 64 intercepting the magnetic field 60 of the other inductor coil 64 and 62. By orienting the winding of the first inductor coil 62 to correspond with the direction of the winding of the second inductor coil 64, opposing magnetic field intensities may be created. A first magnetic field 600 in the first inductor 62 entering from and generated by the second inductor 64 through mutual coupling is typically in opposition to the magnetic field 602 generated by the first inductor 62. In this example, the mutual coupling can provide a negative coupling coefficient.

Figure 7:
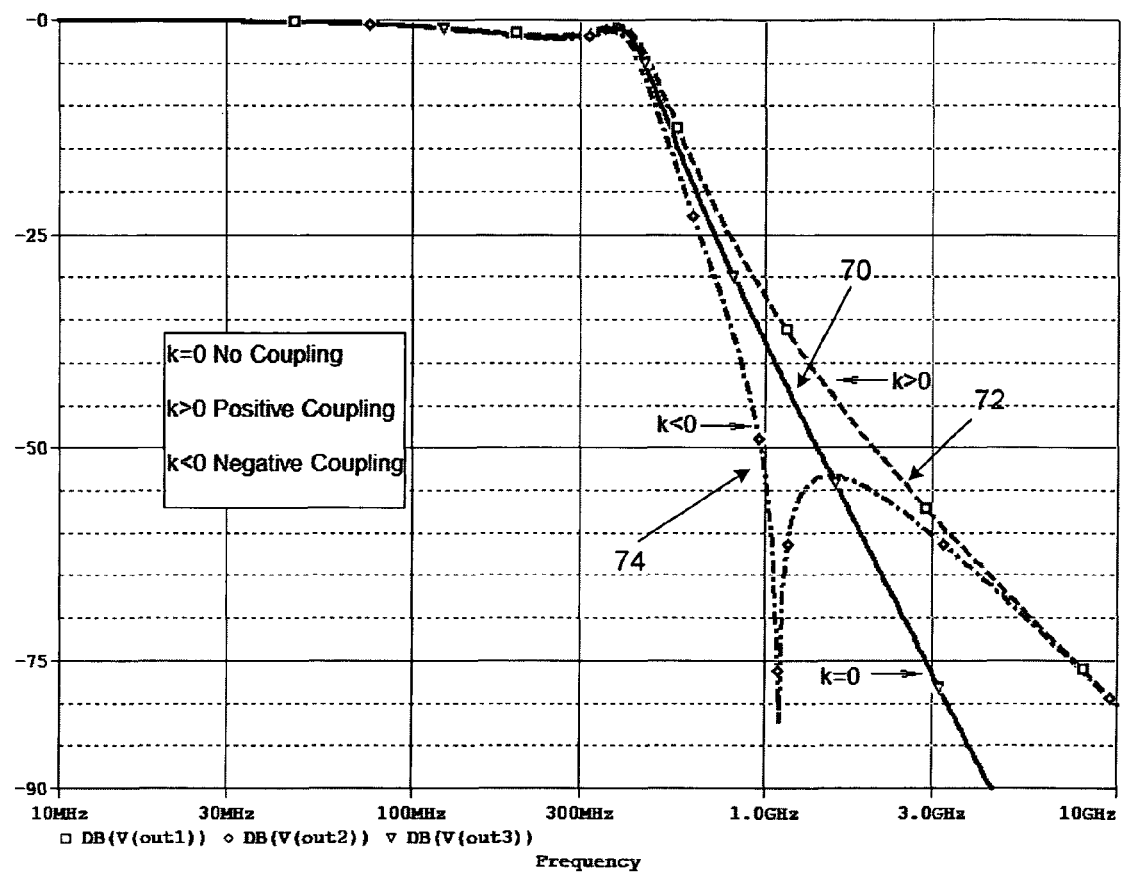
FIG. 7 shows the frequency responses of 5-pole LC filters with differing coupling coefficients.

Referring now to FIG. 7, an example of the frequency response of a $5^{th}$ order filter is shown, illustrating the effect of changing a coupling coefficient, k. By viewing a completely uncoupled inductor (k=0), as in the reference response curve 70, it will appreciated that increasing the coupling coefficient (k>0) causes the frequency response 72 to roll off more slowly as frequency 76 increases. Conversely, providing for a negative coupling coefficient (k<0) causes the frequency response 74 to roll off at a faster rate as frequency 76 increases. It will be appreciated therefore that aspects of the present invention providing a negative coupling coefficient result in a much better rejection band performance for the filter.

It should be noted that the center frequency of the extra band-reject response 74 (with k<0) is typically an independent variable that may be tuned by optimizing circuit parameters and layout of the inductors.

The circuit implemented in the exemplary embodiment achieves a closer to ideal low-pass filter characteristics since it moves the cutoff frequency higher, thereby extending the pass-band to accommodate higher data rates while at the same time maintaining excellent attenuation characteristics in the fixed rejection band.

Figure 8:
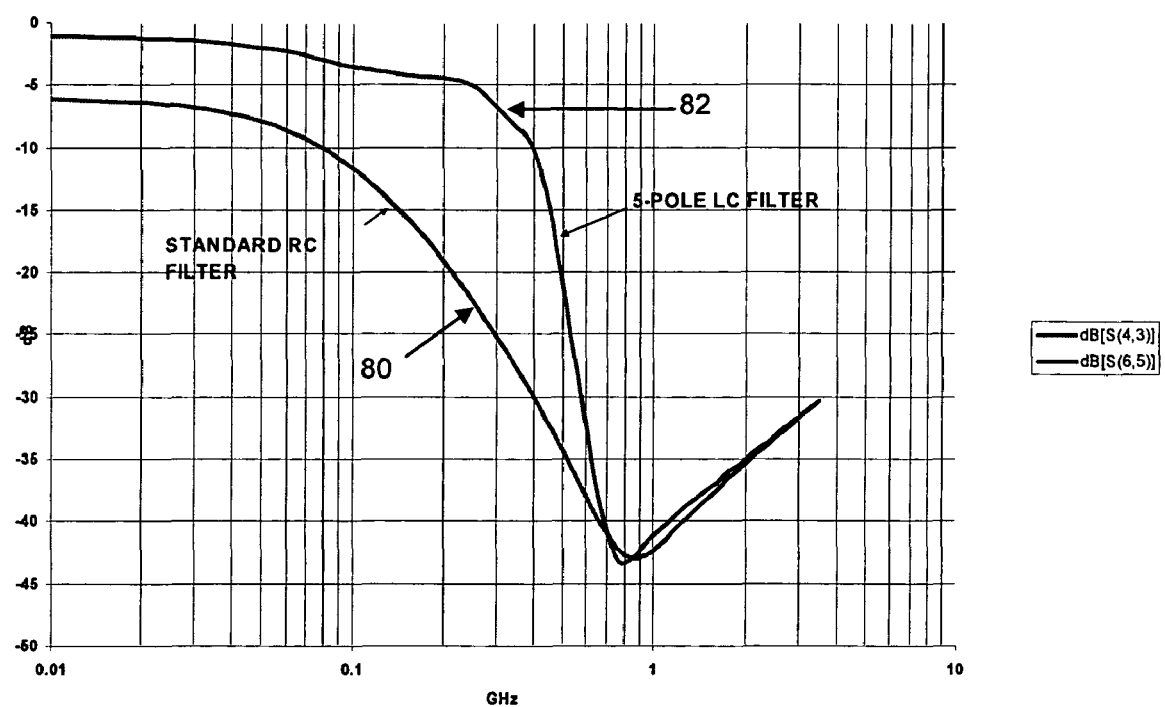
FIG. 8 compares the frequency response of an RC filter and a 5-pole LC filter.

Referring now to FIG. 8, a typical low pass frequency response of a prior art RC filter implementation 80 is shown in comparison to the low pass frequency response of a five pole LC filter 82, as implemented in the certain embodiments of the invention. It will be readily apparent that at comparable attenuation values 86, rejection band performance of the LC filter 82 is much greater than that of the RC filter and it will be appreciated that the performance of the LC filter 82 supports signals exhibiting much higher data rates.

The filter described in the exemplary embodiment is provided as a monolithic integrated circuit structure and is packaged using wafer level packaging technology. Referring to FIG. 4, it can be appreciated that input/output ("I/O") pads 490 and 492 may be provided in a manner that accommodates an underbump metallization (UBM), topside passivation and attachment of solder structures to act as the final circuit connection points to the external environment. These solder structures, as implemented in the exemplary embodiment, are preformed solder spheres of eutectic, high temperature, or lead free solder but may be formed by numerous other techniques such as screen printing or plating. This type of final packaging is very cost competitive with traditional packaging, can be manufactured with less complicated integrated circuit techniques and can offer added benefits of higher performance in smaller sizes. Excellent circuit performance can be achieved since the parasitic elements of capacitance and inductance introduced by the package is minimized with the use of wafer level packaging. Since the die is the package, optimum space utilization may be achieved compared to traditional packaging.

Integration of all filter components, including the use of inductor elements as described herein, plus the addition of ESD protection circuitry combined with wafer level packaging provides enhanced performance in a small footprint at a low cost.

It is apparent that the above embodiments may be altered in many ways without departing from the scope of the invention. For example, one skilled in the art can appreciate that embodiments of the invention may be configured to implement bandpass or high-pass filters. Further, various aspects of a particular embodiment may contain patentably subject matter without regard to other aspects of the same embodiment. Still further, various aspects of different embodiments can be combined together.

Although the present invention has been particularly described with reference to embodiments thereof, it should be readily apparent to those of ordinary skill in the art that changes and modifications in the form and details thereof may be made without departing from the spirit and scope of the invention. For example, those skilled in the art will understand that variations can be made in the number and arrangement of components illustrated in the above diagrams. It is intended that the appended claims include such changes and modifications.

What is claimed is:

1. An apparatus for filtering a signal and for protecting an integrated circuit comprising:

a passive filter electrostatic discharge circuit constructed on an integrated circuit, the passive filter electrostatic discharge circuit including:

a first inductor that is formed as two series connected coils that are coaxially located about a first axis and on two different metal layers of the integrated circuit and separated by a dielectric layer with one of the coils of the first inductor overlaying the other coil wherein, responsive to a current passed through the first inductor, each coil of the first inductor generates a first magnetic field directionally aligned with a corresponding magnetic field generated by the other coil of the first inductor;

a second inductor that is formed as two series connected coils that are coaxially located about a second axis different from the first axis and on the two different metal layers of the integrated circuit and separated by the dielectric layer with one of the coils of the second inductor overlaying the other coil wherein, responsive to a current passed through the second inductor, each coil of the second inductor generates a second magnetic field directionally aligned with a corresponding magnetic field generated by the other coil of the second inductor;

a center point electrically connecting an exit node of the first inductor to an entry node of the second inductor; and a plurality of reverse-biased Zener diodes, each diode capacitively coupling an end of one coil of the passive filter electrostatic discharge circuit to a substrate, the plurality of reverse-biased Zener diodes providing capacitance for the passive filter electrostatic discharge circuit and providing electrostatic discharge protection to another integrated circuit, wherein the first inductor, the second inductor and the plurality of reverse-biased Zener diodes together form a multi-pole passive filter having a filter passband with a filter cut-off frequency, wherein the second inductor is located adjacent to the first inductor, wherein a current of the signal, passing through one, then the other of the first and second inductors, generates a magnetic field in each inductor that is mutually and negatively coupled with the magnetic field in the other inductor, and wherein the negative coupling of the magnetic fields increases a roll-off rate of the filter cut-off frequency at an upper frequency edge of the filter passband of the multi-pole passive filter, thereby improving rejection band performance for the passive filter electrostatic discharge circuit.

2. The apparatus of claim 1, wherein the magnetic field generated by a first coil in the passive filter electrostatic discharge circuit is positively coupled with the magnetic field generated by a second coil in the passive filter electrostatic discharge circuit and is negatively coupled with the magnetic field generated by a third coil in the passive filter.

3. The apparatus of claim 1, wherein a reverse-biased Zener diode capacitively couples the center point to the substrate.

4. The apparatus of claim 1, wherein a reverse-biased Zener diode capacitively couples an entry node of the first inductor to the substrate.

5. The apparatus of claim 4, wherein a reverse-biased Zener diode capacitively couples an exit node of the second inductor to the substrate.

6. The apparatus of claim 5, wherein a reverse-biased Zener diode capacitively couples the center point to the substrate.

7. The apparatus of claim 1, wherein an entry node of the first inductor serves as the entry node of the passive filter electrostatic discharge circuit and an exit node of the second inductor serves as the exit node of the passive filter electrostatic discharge circuit.

8. The apparatus of claim 1, wherein the coils of the first inductor are formed on substantially parallel planes and the first axis is parallel to the second axis.

9. The apparatus of claim 8, wherein the coils of the first inductor and the second inductor are formed on the same substantially parallel planes and wherein the coils of the second inductor are formed around a second shared axis different from the first shared axis.

10. The apparatus of claim 1, wherein the passive filter electrostatic discharge circuit and the another integrated circuit are located in a cellular telephone and wherein the signal includes a clock signal.

11. The apparatus of claim 1, wherein the multi-pole filter comprises a 5-pole filter.

12. The apparatus of claim 1, wherein the passive filter electrostatic discharge circuit is constructed on a wafer scale integrated circuit.

13. A method for integrating a passive filter in a monolithic integrated circuit, comprising the steps of:

connecting a first pair of coils disposed on substantially parallel metallization planes of an integrated circuit to obtain a first inductor, wherein the coils of the first pair of coils are centered on a first axis and separated by a dielectric layer;

connecting a second pair of coils disposed on the substantially parallel metallization planes of the integrated circuit to obtain a second inductor, wherein the coils of the second pair of coils are centered on a second axis and separated by the dielectric layer;

connecting an exit node of the first inductor to an entry node of the second inductor, thereby creating a center node; and forming a plurality of capacitances in the integrated circuit, wherein one or more of the capacitances is a reverse-biased Zener diode that connects a node of the passive filter to a substrate of the integrated circuit, wherein the Zener diode provides electrostatic discharge protection to a different integrated circuit, wherein the first and second pairs of coils are located adjacent to one another on the substantially parallel metallization planes such that magnetic fields generated in the first and second pairs of coils by a current passing through one, then the other of the first inductor and the second inductor negatively couples the first pairs of coil with the second pair of coils, and wherein the passive filter has a passband and the negative coupling increases roll-off rate at a cut-off frequency at an upper frequency edge of the passband, thereby improving rejection band performance for the passive filter.

14. The method of claim 13, wherein at least one of the reverse-biased Zener diodes is coupled to the center node.

15. The method of claim 13, wherein at least one of the reverse-biased Zener diodes is coupled to the entry node of the first inductor and at least one of the reverse-biased Zener diodes is coupled to the exit node of the second inductor.

16. The method of claim 13, further comprising providing the monolithic integrated circuit in a wafer level package.

17. The method of claim 13, wherein the monolithic integrated circuit is packaged in a wafer level package and wherein the different integrated circuit is a telephony integrated circuit provided in a cellular telephone.

18. The method of claim 17, wherein the passive filter is configured to attenuate radio frequency (RF) carrier signals used by the cellular telephone.

19. The method of claim 18, wherein the current passing through the first inductor and the second inductor is generated by a clock signal.

20. The method of claim 17, wherein the passive filter restricts entry of radio frequency (RF) energy to the cellular telephone.

21. The method of claim 17, wherein the passive filter prevents RF energy generated within the cellular telephone from radiating outside the cellular telephone.

22. An integrated circuit having a passive filter for filtering a signal and for protecting at least one other integrated circuit from electrostatic discharge, comprising:

a pair of physically adjacent inductors, each inductor having at least two series connected coils that are coaxially located proximately on two or more different metal layers of the integrated circuit that are separated by dielectric, wherein directionally aligned magnetic fields are generated by the coils of each inductor in response to a current passed through each inductor;

a center node electrically connected to a terminal of one inductor of the pair of inductors and a terminal of the other inductor, thereby creating an inductive element having an entry node and an exit node in addition to the center node, wherein magnetic fields generated in the pair of inductors by a current of the signal, passed through one inductor and thence through the other inductor, are mutually and negatively coupled with one another; and a plurality of capacitors, each capacitor coupling one of the nodes of the inductive element to a substrate, wherein the plurality of capacitors includes at least one reverse-biased Zener diode that provides capacitance for the passive filter and electrostatic discharge protection to the at least one other integrated circuit, wherein the pair of inductors and the plurality of capacitors together form a multi-pole passive filter configured to restrict passage of radio frequency (RF) energy and pass data, control and clocking signals, and wherein the integrated circuit is provided in wafer level packaging and the passive filter comprises a portion of the transmission path of the signal.

23. The integrated circuit of claim 22, wherein:

the passive filter has a pass band and a rejection band with a cut-off frequency at an upper frequency edge of the pass band; and the negative coupling of the magnetic fields increases the frequency response roll-off rate at the filter cut-off frequency, thereby improving rejection band performance for the passive filter.

* * * * *